July 9, 1968 W. G. REIMANN 3,391,457

SHIELDED CIRCUIT CONDUCTOR

Filed Oct. 22, 1965 2 Sheets-Sheet 1

INVENTOR.
WILLIAM G. REIMANN

BY Frederic P. Smith

ATTORNEY

SHIELDED CIRCUIT CONDUCTOR

Filed Oct. 22, 1965 2 Sheets-Sheet 2

INVENTOR.
WILLIAM G. REIMANN

BY Frederic P. Smith

ATTORNEY

United States Patent Office 3,391,457
Patented July 9, 1968

3,391,457
SHIELDED CIRCUIT CONDUCTOR

William G. Reimann, Los Angeles, Calif., assignor to Litton Systems, Inc., Beverly Hills, Calif.
Filed Oct. 22, 1965, Ser. No. 500,568
8 Claims. (Cl. 29—625)

ABSTRACT OF THE DISCLOSURE

A process for forming a completely shielded circuit conductor in which the circuit conductor and the shielding surrounding it are formed by the provision of conducting and insulating layers of material and the selective removal of portions thereof.

Figure 1:
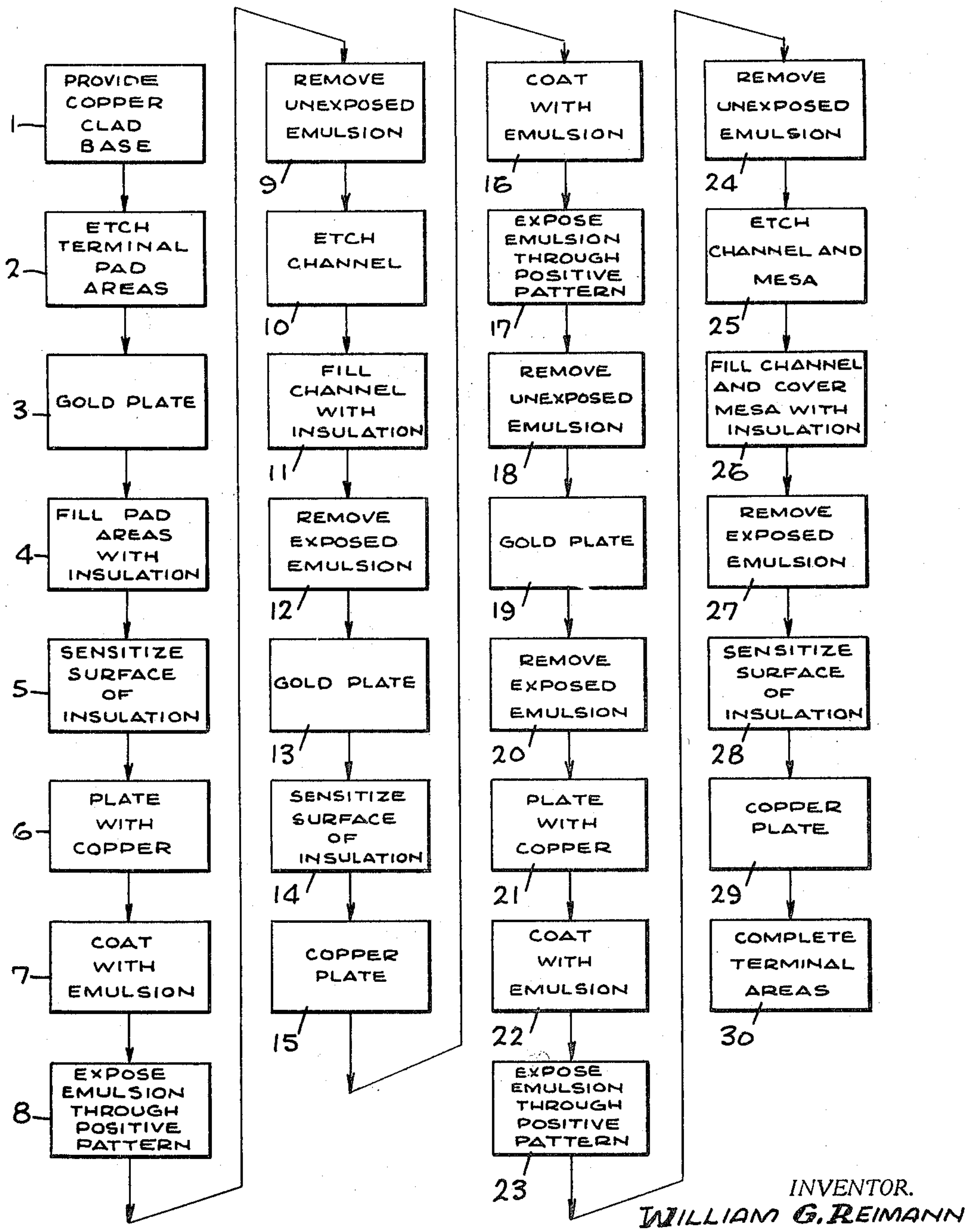

This invention relates in general to printed circuits and in particular to an improved printed circuit having shielded circuit conductors thereon and the method of manufacture thereof.

Much effort is presently being directed to advancing the state of the electronics art through miniaturization. Developments such as module and chip utilization and multilayer laminates are all directed towards achieving ever smaller and more compact electronic assemblies. Size reduction, however, inevitably aggravates already severe noise problems in sensitive circuits. Undesired coupling or "cross-talk" is invariably a limiting factor in the design of miniaturized circuits.

Cross-talk problems are likely to be especially severe in digital systems. For example, a Fourier analysis of a typical digital pulse reveals a substantial noise content extending well into the UHF portion of the spectrum. This characteristic places severe restrictions on the packaging and/or routing of digital circuits in close proximity to sensitive electronic circuits or components.

The sensitivity of many circuits to cross-talk can be controlled or substantially eliminated by adequate shielding. One such method of providing adequate shielding for a printed circuit conductor is illustrated in patent application No. 438,521, filed Mar. 10, 1965, entitled, Shielded Etched Circuit Conductor, and assigned to the same assignee as the present application. In that application, a shallow channel is formed in a first conductive layer and the channel is then filled with insulating material. A second conductive layer is placed on the first conductive layer and the insulating material, and is then etched away to leave on the insulating material a signal conductor of lesser width. Additional conductive material is then deposited on the first conductive layer to form a third conductive layer around the signal conductor and separated therefrom by a channel. This channel, the sides of which extend somewhat above the level of the signal conductor, is then filled with insulating material. Finally, the entire structure is plated with a fourth conductor layer. The resulting cross-section comprises the signal conductor entirely surrounded by an insulating layer which, in turn, is surrounded by a conductive layer forming a continuous shield. In practice, while it has been found feasible to deposit a relatively small amount of conductive material on the first conductive layer to form the third conductive layer and still maintain a channel around the signal conductor, the deposition of any large amount of such conductive material (while still maintaining the channel) has proved to be impractical. The channel around the signal conductor is inevitably filled up by the continuous omnidirectional spreading of the deposited material. Thus, the above-mentioned process has proven to be impractical where it is desired to separate the signal conductor from the surrounding continuous conductive shield by a large amount of insulating material.

In an alternative method described in the above-cited application, the fourth conductive layer has a second channel etched therein down to the signal conductor and the insulating material. This channel is then filled with insulating material and a fifth conductive layer plated thereover. While this technique provides higher shield heights, it involves many more process steps and does not provide sufficient control over the width of the channel separating the signal conductor from the conductive shield. In addition, the etching process for the second channel must be carefully controlled so as to not attack the signal conductor itself.

The present invention has succeeded in overcoming the above-mentioned disadvantages by providing an improved method of manufacturing a shielded circuit conductor in which the signal conductor and the adjacent but separated conductive shield are formed in a single etching process, the process simultaneously forming the desired channel around the signal conductor. The channel is then filled with insulating material as in the above-referenced process.

It is therefore the primary object of the present invention to provide a new and improved shielded printed circuit conductor and the method of manufacture thereof.

It is another object of the invention to provide a process of forming a shielded circuit conductor in which the spacing between the signal conductor and the surrounding conductive material can be carefully regulated to any desired width.

It is a further object of the invention to provide a process of manufacturing a shielded printed circuit conductor in which the separation channel between the signal conductor and the surrounding shielding is formed by back-etching.

The novel features which are believed to be characteristic of the invention, both as to its organization and method of operation, together with further objects and advantages thereof, will be better understood from the following description considered in connection with the accompanying drawings. It is to be expressly understood, however, that the drawings are for purposes of illustration and description only and are not intended as a definition of the limits of the invention.

Figure 2:
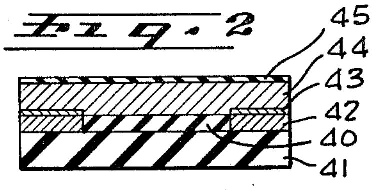

FIGURE 1 is a diagrammatic flow chart illustrating the steps of the process of the invention; and FIGURES 2 through 13 depict an etched or printed circuit of the invention at various stages of the process shown in FIGURE 2.

In the description of the invention to follow, corresponding reference numerals have been carried over throughout the figures to designate like parts of the invention.

In step 1, there is provided a copper clad insulating base, which base may be of plastic, fiberglass or any other substrate deemed appropriate in view of the ultimate intended use of the circuit. The copper cladding forms a first continuous conductive layer. In a typical example, the thickness of the first conductive layer may be about 1.35 mils. In step 2 of the process, a terminal pad pattern is etched into the first conductive layer to remove the copper cladding from the areas of the substrate underlying the termination areas of the conductive pattern to be formed subsequently. The surface of the conductive layer is next lightly plated with gold to form a first continuous etch-resistant layer. The amount of gold deposited in this third step of the process is advantageously about $10^{-5}$ inch. In step 4, the etched pad areas are filled with electrical insulation which may be a suitable plastic known in this art. The surface of the insulation is then sensitized to make it electrically conductive, and copper plated on this surface and on the etch-resistant layer to form a second continuous conductive layer which is in substantially continuous electrical contact with the first conductive layer. The thickness of the second conductive layer is advantageously about 5–10 mils. The entire surface of the second conductive layer is next, as step 7, coated with a photosensitive etch-resistant layer which may, for example, be any one of the known photo-engraving emulsions commonly used in this art.

FIGURE 2 shows, in cross-section, insulating base 41, first conductive layer 42 with terminal pad 40, first etch-resistant layer 43, second conductive layer 44, and photosensitive emulsion layer 45.

Figure 3:
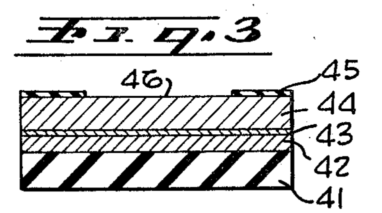

The photosensitive emulsion of layer 45 is exposed, in step 8, to a positive image of the designed conductor pattern. That is, a portion of the emulsion peripheral to the area corresponding to the signal conductor is exposed, while that portion covering the surface areas of conductive layer 44 corresponding to the signal conductor is shielded from the light so as to remain unexposed. In step 9, the exposed emulsion is removed so that the underlying surface area 46 of conductive layer 44 is exposed for etching while the remainder of the surface of layer 44 is protected by the exposed portion of the etch-resistant emulsion of layer 45. The multilayer structure at this stage of the process is illustrated in FIGURE 3 which is a cross-section taken through a portion removed from a terminal area.

Figure 4:
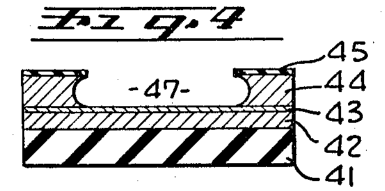

As the tenth step of the process of FIGURE 1, a shallow channel 47, shown in FIGURE 4, is formed by etching the exposed area 46 of conductive layer 44. The etchant is prevented from penetrating the underlying conductive layer 42 by the etch-resistant layer 43. Because of undercut, the channel 47 will be somewhat wider than the eventual width of the signal conductor.

Figure 5:
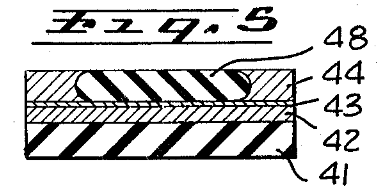
Figure 6:
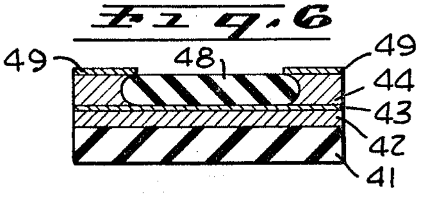
Figure 7:
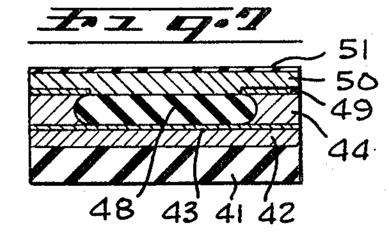
Figure 8:
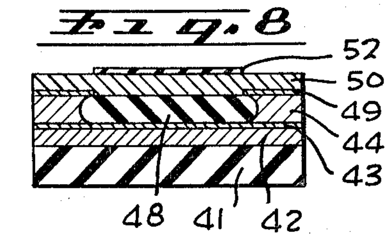

In step 11, channel 47 is filled with insulating material 48 to form the structure shown in FIGURE 5. The exposed portion of the emulsion layer 45 may then be removed as step 12. The surface of the second conductive layer 44 is coated in step 13 with a thin gold film to form an etch-resistant layer 49, as shown in FIGURE 6. The surface of the insulating material 48 is next, as step 14, sensitized so it will accept a conductive coating 50 which is deposited in accordance with step 15. A typical thickness for the conductive layer 50 is 2 mils. In step 16, the surface of layer 50 is coated with a photosensitive etch-resistant emulsion 51 to form the structure shown in FIGURE 7.

In step 17, the second emulsion layer 51 is exposed through a positive image of the same conductor pattern through which the emulsion layer 45 was exposed in step 8. The positive image is substantially in register with the previous positive image. Thus, portions of the layer 51 corresponding to the exposed portions of layer 45 are exposed in step 17, while areas corresponding to unexposed portions of layer 45 remain unexposed in layer 51. The unexposed portions of emulsion layer 51 are removed as step 18 to bare the underlying areas of the third conductive layer 50. As step 19, the bared underlying areas of the third conductive layer 50 are gold plated, such gold plated area corresponding to the conductor pattern. As step 20 the exposed emulsion is removed leaving the configuration shown in FIGURE 8, the gold plated area being designated by numeral 52.

Figure 9:
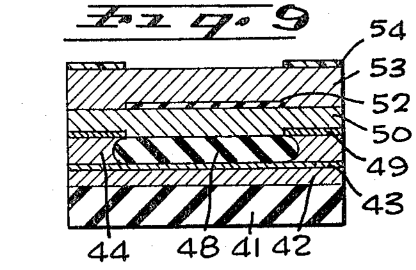
Figure 10:
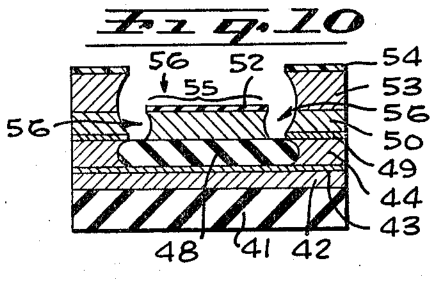

As step 21, the conductive layer 50 and the gold plated area 52 are plated with a copper conductive layer 53. As steps 22 through 24, the conductive layer 53 is coated with an emulsion layer 54, the emulsion layer 54 is then exposed to a positive image of the same conductor pattern through which the emulsion layer 51 was exposed in step 17, and the unexposed portions of the emulsion layer 54 are removed to bare the underlying areas of conductive layer 53, as shown in FIGURE 9.

Figure 11:
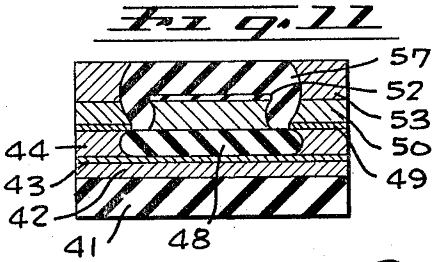

As step 25, the exposed portion of the conductive layer 53 is subject to an etchant. The etchant etches away the exposed portions of the conductive layer 53, thus forming a channel in conductive layer 53. The etching process is partially stopped by the surface of the etch-resistant material 52 but continues to etch away the portions of the conductive layer 50 adjacent the edges of the etch-resistant layer 52. The etching process continues until the etchant reaches the insulating layer 48 and the etch-resistant layer 49. At this point in the process, as shown in FIGURE 11, a mesa 55 corresponding to the signal conductor of the pattern is formed, the mesa 55 having channel 56 above and on both sides thereof. Because of the undercutting effect of the etchant, the channel 56 is composed of two concave surfaces, one formed in the conductive layers 50 and 53 and the other formed in the portion of the conductive layer 50 which was covered by the etch-resistant material 52. The etching process can be continued until the channel 56 is as wide as desired.

Figure 12:
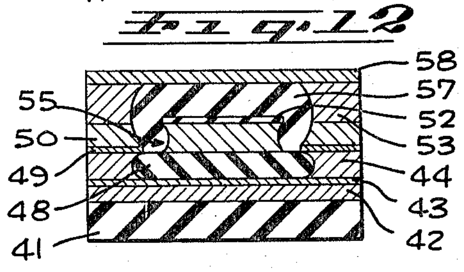

As step 26, the channel 56 is filled and the mesa 55 covered with insulating material 57. The exposed portions of the emulsion layer 54 are then removed, as step 27, yielding the structure shown in FIGURE 11. The surface of the insulating material 57 in channel 56 is then sensitized, as step 28, to receive a conductive layer. As the penultimate step 29 of the process, a layer of conductive material 58 is plated on the exposed surface of the conductive layer 53 and the sensitized surface of the insulating material 57. The final conductive layer 58 completes a conductive shield which entirely surrounds the mesa or signal conductor 55. The completed structure is shown in FIGURE 12.

Figure 13:
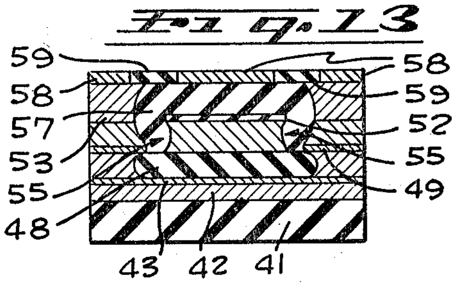

To complete the terminal areas, a pad, or alternatively, a ring formation is etched in the final conductive layer 58 above the pads etched in the first conductive layer 42. The etched pad or ring is filled with insulating material to complete step 30 in the process. A cross-section of the resultant structure in the terminal area is shown in FIGURE 13. The advantage of such a formation is that a hole may be drilled through the signal conductor in the terminal region without passing the drill through any part of the sheild. The inner surface of the hole is advantageously sensitized and plated with copper and a suitable connector may be welded or soldered into the hole in accordance with the usual practice.

Having described the invention, it is apparent that numerous modifications and departures may be made by those skilled in the art. For example, materials other than copper and gold may be used. Additionally, the etch-resistant masks employed in the process may be formed in any conventional manner known in the art. Negative as well as positive printed circuit techniques may also be used. Still other possibilities will become apparent to those familiar with the field of the invention. Therefore, the invention herein described is to be construed as limited only by the spirit and scope of the appended claims.

What is claimed is:

1. Process of making a shielded circuit conductor comprising the steps of: providing an insulating base member having a continuous first conductive layer thereon; coating said first conductive layer to form a continuous first etch-resistant conductive layer thereon; coating said first etch-resistant conductive layer to form a continuous second conductive layer thereon; coating said second conductive layer with photo-engraving emulsion to form a first emulsion layer thereon; exposing said first emulsion layer to a positive image of a shielded conductor pattern; removing the unexposed emulsion of said first emulsion layer to uncover the portions of said second conductive layer corresponding to the shielded conductor of said pattern; etching the uncovered area of said second conductive layer to produce a first channel substantially wider than said area; removing the exposed emulsion of said first emulsion layer; filling said first channel with an etch-resistant insulating material; coating said second conductive layer to form a second etch-resistant conductive layer thereon; sensitizing the surface of said insulating material in said channel; coating said second etch-resistant conductive layer and said sensitized surface to form a continuous third conductive layer thereon; coating said third conductive layer with a photoengraving emulsion to form a second emulsion layer thereon; exposing said second emulsion layer to a positive image of said shielded conductor pattern, said positive image being substantially in register with the above-recited positive image; removing the unexposed emulsion of said second emulsion layer to uncover portions of said third conductive layer; coating said uncovered portions of said third conductive layer with a third etch-resistant layer; removing the exposed emulsion of said second emulsion layer; coating said third conductive layer and said third etch-resistant layer with a fourth conductive layer; coating said fourth conductive layer with a photoengraving emulsion to form a third emulsion layer thereon; exposing said third emulsion layer to a positive image of said shielded conductor pattern, said positive image being substantially in register with said previous positive images; removing the unexposed emulsion of said third emulsion layer to uncover said fourth conductive layer; etching said third conductive layer and said fourth conductive layer to form said conductor pattern and a second channel between said conductor pattern and said third and fourth conductive layers, said conductor pattern being lower than said third and fourth conductive layers; removing the exposed emulsion of said third emulsion layer; filling said etched areas including said second channel with an insulating material; sensitizing the surface of said insulating material in said etched areas; and coating said fourth conductive layer and said sensitized surface to form a continuous fifth conductive layer thereon.

2. Process of making a shielded circuit conductor comprising the steps of: providing an insulating base member having a continuous first conductive layer thereon; coating said first conductive layer with a continuous first etch-resistant conductive layer; coating said first etch-resistant layer with a continuous second conductive layer in substantially continuous electrical contact with said first conductive layer; coating said second conductive layer with a photoengraving emulsion to form a first emulsion layer; exposing a portion of said first emulsion layer peripheral to a shielded conductor pattern; removing the unexposed emulsion of said first emulsion layer to uncover the portion of said second conductive layer corresponding to the shielded conductor of said pattern; etching the uncovered area of said second conductive layer to form a first channel substantially wider than said conductor; removing the exposed emulsion of said first emulsion layer; filling said first channel with an etch-resistant insulating material to form an insulating base for said conductor; coating said second conductive layer with a second etch-resistant conductive layer; sensitizing the surface of the insulating material in said channel; coating said second etch-resistant layer and said sensitized surface with a continuous third conductive layer in substantially continuous electrical contact with said second conductive layer; coating said third conductive layer with a photoengraving emulsion to form a second emulsion layer; exposing those portions of said second emulsion layer peripheral to said shielded conductor pattern; removing the unexposed emulsion of said second emulsion layer to uncover the portion of said third conductive layer corresponding to the shielded conductor of said pattern; coating said uncovered portion of said third conductive layer with a third etch-resistant layer; removing the exposed emulsion of said second emulsion layer; coating said third etch-resistant layer and said third conductive layer with a fourth conductive layer; coating said fourth conductive layer with a photoengraving emulsion to form a third emulsion layer; exposing those portions of said third emulsion layer peripheral to said shielded conductor pattern; removing the unexposed emulsion of said third emulsion layer to uncover the portion of said fourth conductive layer corresponding to the shielded conductor of said pattern; etching said third conductive layer and said fourth conductive layer to form said circuit conductor and to form a non-conductive second channel between said circuit conductor and said third and fourth conductive layers, said circuit conductor being smaller in height than said third and fourth conductive layers; removing the exposed emulsion of said third emulsion layer; filling said etched areas including said second channel with an insulating material to form an insulating wall around and over said circuit conductor; sensitizing the surface of the insulating material in said second channel; coating said fourth conductive layer and said sensitized surface with a continuous fifth conductive layer to complete a substantially continuous conductive shield around and insulated from said shielded conductor.

3. Process of making a shielded circuit conductor comprising the steps of: providing a multilayer laminated structure having a base member, a continuous first conductive layer on said base member, a continuous first etch-resistant conductive layer on said first conductive layer, a continuous second conductive layer on said first etch-resistant layer, and a first photosensitive etch-resistant layer on said second conductive layer; exposing said first photosensitive layer through a positive image of a shielded conductor pattern; removing the unexposed portion of said first photosensitive layer to uncover the portion of second conductive layer corresponding to the shielded conductor of said pattern; etching the uncovered area of said second conductive layer to produce a first channel substantially wider than said conductor; removing the exposed portion of said first photosensitive etch-resistant layer; filling said first channel with an etch-resistant insulating material to form an insulating base for a narrower shielded conductor; forming a second etch-resistant conductive layer on said second conductive layer; forming a continuous third conductive layer on said second etch-resistant layer and the surface of the insulating material in said first channel; forming a second photosensitive etch-resistant layer on said third conductive layer; exposing said second photosensitive layer through a positive image of said shielded conductor pattern, said positive image being substantially in register with said previous positive image; removing the unexposed portion of said second photosensitive layer to uncover a portion of said third conductive layer corresponding to said shielded conductor; forming a continuous third etch-resistant layer on said uncovered portions of said third conductive layer; removing the exposed portion of said second photosensitive layer; coating said third etch-resistant layer and said third conductive layer with a fourth conductive layer; forming a third photosensitive etch-resistant layer on said fourth conductive layer; exposing said third photosensitive layer to a positive image of said shielded conductor pattern, said positive image being substantially in register with said previous positive images; removing the unexposed portion of said third photosensitive layer to uncover a portion of said fourth conductive layer corresponding to said shielded conductor; etching the uncovered area to remove portions of said fourth conductive layer and said third conductive layer to leave a conductive mesa on said insulating base separated from said third and fourth conductive layers by a non-conductive second channel; removing the exposed portion of said third photosensitive layer; filling said removed portions including said second channel with an insulating material to form an insulating wall around and over said conductive mesa; and coating said third conductive layer and the surface of said insulating material in said second channel with a continuous fifth conductive layer.

4. Process of making a shielded circuit conductor comprising the steps of: providing a multilayer laminated structure having a continuous first conductive layer, a continuous first etch-resistant conductive layer on said first conductive layer, a continuous second conductive layer in substantially continuous electrical contact with said first conductive layer, and a first photosensitive etch-resistant layer on said second conductive layer; exposing said first photosensitive layer through positive image of a shielded conductor pattern; removing the unexposed portion of said first photosensitive layer to uncover said second conductive layer; etching the uncovered area of said second conductive layer to produce a first channel substantially wider than said area; removing the exposed portion of said first photosensitive layer; filling said first channel with an etch-resistant insulating material; forming a second etch-resistant conductive layer on said second conductive layer; forming a continuous third conductive layer on said second etch-resistant layer and the surface of the insulating material in said first channel, said third conductive layer being in substantially continuous electrical contact with said second conductive layer; forming a second photosensitive etch-resistant layer on said third conductive layer; exposing said second photosensitive layer through a positive image of said shielded conductive pattern, said positive image being substantially in register with said previous positive image; removing the unexposed portion of said second photosensitive layer to uncover said third conductive layer; forming a continuous third etch-resistant layer on said third conductive layer; removing the exposed portions of said second photosensitive layer; forming a continuous fourth conductive layer on said third etch-resistant layer and said third conductive layer; forming a third photosensitive etch-resistant layer on said fourth conductive layer; exposing said third photosensitive layer through a positive image of said shielded conductor pattern; removing the unexposed portion of said third photosensitive layer to uncover said fourth conductive layer; etching said fourth conductive layer and said third conductive layer to leave a conductive mesa on said etch-resistant insulating material, said conductive mesa being separated from said third and fourth conductive layers by a second insulating channel and being lower in height than said third and fourth conductive layers; removing the exposed portion of said third photosensitive layer; filling said etched areas including said channel with an insulating material; and forming a fifth conductive layer on the insulating material in said second channel and said fourth conductive layer.

5. Process of making a shielded circuit conductor comprising the steps of: providing a multilayer laminated structure having a continuous first conductive layer, a continuous first etch-resistant conductive layer on said first conductive layer, and a continuous second conductive layer in substantially continuous electrical contact with said first conductive layer; forming a first etch-resistant mask on said second conductive layer, said mask covering areas of said layer outside a shielded conductor pattern; etching the unmasked area of said second conductive layer to form a first channel substantially wider than shielded conductor of said pattern; removing said first etch-resistant mask; filling said first channel with an etch-resistant insulating material; forming a second etch-resistant conductive layer on said second conductive layer; forming a continuous third conductive layer on said second etch-resistant layer and on the surface of the insulating material in said first channel, said third conductive layer being in substantially continuous electrical contact with said second conductive layer; forming a second etch-resistant mask on said third conductive layer, said mask covering areas of said third conductive layer corresponding to the shielded conductor of said pattern; forming a continuous fourth conductive layer on said third conductive layer and said second etch-resistant mask; forming a third etch-resistant mask on said fourth conductive layer, said mask covering areas of said fourth conductive layer outside said shielded conductor pattern; etching said third and fourth conductive layers to remove the unmasked portion thereof overlying the insulating material in said first channel, the portions of said third and fourth conductors underlying said third etch-resistant mask remaining substantially intact, to leave a conductive mesa substantially narrower than the shielded conductor of said pattern, said conductive mesa being separated from said third and fourth conductive layers by a second non-conductive channel and lower in height than said third and fourth conductive layers; removing said third etch-resistant mask; filling said removed portions of said third and fourth conductive layers with an etch-resistant insulating material; and forming a fifth conductive layer on the last-recited insulating material and said fourth conductive layer.

6. Process of making a shielded circuit conductor comprising the steps of: providing a multilayer laminated structure having a continuous first conductive layer, a continuous first etch-resistant conductive layer on said first conductive layer, and a continuous second conductive layer in substantially continuous electrical contact with said first conductive layer; etching said second conductive layer to produce therein a first channel corresponding to a shielded conductor pattern and substantially wider than the conductor of said pattern; filling said first channel with an insulating material; forming a second etch-resistant conductive layer on said second conductive layer; forming a continuous third conductive layer on said second etch-resistant layer and on the surface of said insulating material, said third conductive layer being in substantially continuous electrical contact with said second conductive layer; forming a continuous third etch-resistant layer on said third conductive layer correpsonding to said shielded conductor pattern; forming a continuous fourth conductive layer on said third etch-resistant layer and said third conductive layer; etching a second channel in said third and fourth conductive layers to produce a conductive mesa on the insulating material in said first channel, said mesa being lower than and electrically separated from the remaining portion of said third and fourth conductive layers; filling the second channel with an insulating material; and forming a fifth conductive layer on the insulating material in said second channel and in substantially continuous electrical contact with the portion of said fourth conductive layer surrounding said mesa.

7. Process of making a printed circuit comprising the steps of: providing a multilayer laminated structure having a first conductive layer; forming a channel in said first conductive layer, said channel corresponding to a printed circuit conductor pattern and being substantially wider than the conductor of said pattern; filling said channel with insulation; forming a second conductive layer on said first conductive layer and said insulation; simultaneously forming from said second conductive layer the printed circuit conductor of said pattern on the insulation in said channel and a shielding conductive layer on the portion of said first conductive layer peripheral to the insulation in said channel, said shielding conductive layer being higher than said printed circuit conductor and separated therefrom to provide a second channel around said conductor with walls extending above the upper surface thereof; filling said second channel and the area above said printed circuit conductor and between said shielding conductive layer with insulation; and forming a third conductive layer over said shielding conductive layer and over the insulation in said second channel.

8. Process of making a shielded circuit conductor comprising the steps of: providing a multilayer laminated structure having a continuous first conductive layer, a continuous first etch-resistant conductive layer on said first conductive layer, and a continuous second conductive layer in substantially continuous electrical contact with said first conductive layer; forming a first etch-resistant conductive mask on said second conductive layer, said mask covering areas of said layer outside a shielded conductor pattern; etching the unmasked area of said second conductive layer to form a first channel substantially wider than shielded conductor of said pattern; filling said first channel with an etch-resistant insulating material; forming a second etch-resistant conductive layer on said second conductive layer; forming a continuous third conductive layer on said second etch-resistant layer and on the surface of the insulating material in said first channel, said third conductive layer being in substantially continuous electrical contact with said second conductive layer; forming a second etch-resistant mask on said third conductive layer, said mask covering areas of said third conductive layer corresponding to the shielded conductor of said pattern; forming a continuous fourth conductive layer on said third conductive layer and said second etch-resistant mask; forming a third etch-resistant conductive mask on said fourth conductive layer, said mask covering areas of said fourth conductive layer outside said shielded conductor pattern; etching said third and fourth conductive layers to remove the unmasked portion thereof overlying the insulating material in said first channel, the portions of said third and fourth conductors underlying said third etch-resistant mask remaining substantially intact, to leave a conductive mesa substantially narrower than the shielded conductor of said pattern, said conductive mesa being separated from said third and fourth conductive layers by a second non-conductive channel and lower in height than said third and fourth conductive layers; filling said removed portions of said third and fourth conductive layers with an etch-resistant insulating material; and forming a fifth conductive layer on the last-recited insulating material and said fourth conductive layer.

References Cited

UNITED STATES PATENTS

| | | | |
|---|---|---|---|
| 2,734,150 | 2/1956 | Beck | 24—155.5 |
| 3,169,892 | 2/1965 | Lemelson | 29—155.5 |

JOHN F. CAMPBELL, *Primary Examiner.*

C. E. HALL, *Assistant Examiner.*